United States Patent [19]

Hanna

[11] Patent Number: 5,955,980
[45] Date of Patent: Sep. 21, 1999

[54] CIRCUIT AND METHOD FOR CALIBRATING A DIGITAL-TO-ANALOG CONVERTER

[75] Inventor: John Edward Hanna, Chandler, Ariz.

[73] Assignee: Motorola, Inc., Schaumburg, Ill.

[21] Appl. No.: 08/943,442

[22] Filed: Oct. 3, 1997

[51] Int. Cl.[6] .................................................. H03M 1/10
[52] U.S. Cl. .......................................... 341/120; 341/144
[58] Field of Search .................................... 341/118, 120, 341/121, 144

[56] References Cited

U.S. PATENT DOCUMENTS

| | | | |
|---|---|---|---|
| 5,021,784 | 6/1991 | Groeneveld et al. | 341/120 |
| 5,243,347 | 9/1993 | Jackson et al. | 341/144 |
| 5,646,619 | 7/1997 | Daubert et al. | 341/118 |
| 5,666,118 | 9/1997 | Gersbach | 341/120 |

*Primary Examiner*—Marc S. Hoff
*Assistant Examiner*—Peguy JeanPierre
*Attorney, Agent, or Firm*—Lanny L. Parker

[57] ABSTRACT

A high precision DAC (10) incorporates a low precision DAC (18) and current sources (15(A)–15(O)) whose full-scale currents are adjusted to match a reference current generated by an analog calibration circuit (28). An additional low precision DAC (20) and another current source (16) are spares that allow periodic calibration of the high precision DAC (10) to occur in the background without taking the high precision DAC (10) off-line or out of service. A thermometer code generated by a thermometer code circuit (12) is used by a thermometer mapper circuit (13) to enable the most recently calibrated current sources to generate currents having the highest probability for use by the high precision DAC (10).

17 Claims, 4 Drawing Sheets

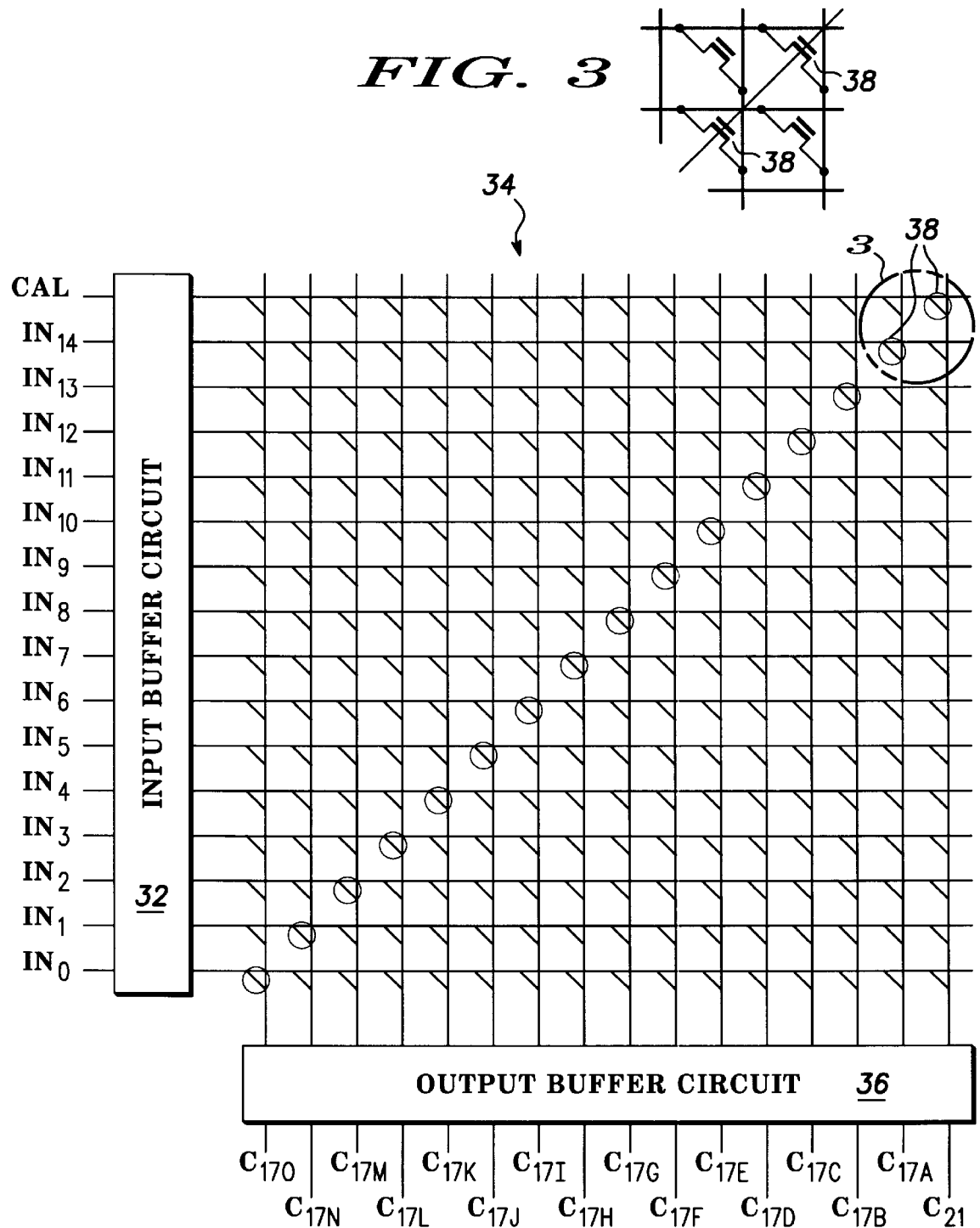

5,955,980

CIRCUIT AND METHOD FOR CALIBRATING A DIGITAL-TO-ANALOG CONVERTER

BACKGROUND OF THE INVENTION

The present invention relates, in general, to integrated circuits and, more particularly, to digital-to-analog converters.

For a cellular voice system, the full band of channel frequencies received from an antenna is digitized at baseband or at a narrowband Intermediate Frequency (IF). Then the received channel frequencies are converted by a Digital Signal Processor (DSP) to voice band signals for transfer over local phone lines. In the transmit chain, DSPs reconvert the voice band signals to digitized multiple voice channels that are frequency multiplexed subcarriers. Digitization at baseband or at IF avoids many problems by filtering off-channel signals.

The digitized signals are typically converted back to an analog signal using Digital-to-Analog Converters (DACs). DACs can be either low precision or high precision depending on the number of input data signals they receive. A ten bit DAC is considered a lower precision DAC than a fourteen bit DAC. In other words, a higher precision DAC receives a greater number of input data signals and provides finer increments of current values in generating an output current than a lower precision DAC.

A high precision DAC could be implemented using a plurality of sufficiently accurate low precision DACs. For example, a high precision fourteen bit DAC could be implemented using sixteen ten bit DACs. The sum of the full-scale currents from the individual low precision DACs is the full-scale current of the high precision DAC. The full-scale currents from each of the low precision DACs are matched to a reference current to provide sufficient accuracy and to calibrate the high precision DAC.

Further, a high precision DAC can be implemented using a plurality of low precision DACs in conjunction with a spare low precision DAC. The spare low precision DAC maintains the current of the high precision DAC while one of the low precision DACs is calibrated. Thus, the spare low precision DAC allows periodic calibration of the high precision DAC without taking the high precision DAC off-line.

Calibration of the low precision DACs is initiated by replacing one of the low precision DACs with the spare DAC. The spare DAC maintains the current of the high precision DAC while the low precision DAC that has been replaced is calibrated to have a current that matches the reference current. Then, another low precision DAC is selected and calibrated. This process is repeated until the high precision DAC is calibrated. However, this technique of randomly selecting a DAC for calibration and replacing the DAC to be calibrated by the spare DAC still produces a high precision DAC having a nonlinear output signal.

Accordingly, it would be advantageous to have a method and a circuit for calibrating a DAC. It would be of further advantage to have the ability to calibrate the DAC while not taking the high precision DAC off-line or out of service.

BRIEF DESCRIPTION OF THE DRAWINGS

FIG. 2 is a block diagram of a thermometer mapper circuit that has a particular state value in accordance with the present invention;

FIG. 3 is an exploded view of a portion of an array shown in FIG. 2;

DETAILED DESCRIPTION OF THE DRAWINGS

Generally, the present invention provides a method for improving Digital-to-Analog Converter (DAC) linearity by incorporating multiple DACs and current sources whose full-scale output currents are periodically readjusted to match a reference current. Composite high precision DAC 10 includes a primary DAC conversion circuit 11 and a spare DAC circuit 14. Spare DAC circuit 14 includes an auxiliary low precision DAC 20 and a current source 16 that allow periodic calibration of composite high precision DAC 10 without taking it off-line or out of service. In other words, a single low precision DAC 20 and a single spare current source 16 are more than the minimum number of DACs and current sources needed to provide the functionality of composite high precision DAC 10. Thus, low precision DAC 20 is an auxiliary or "spare" DAC, and current source 16 is a "spare" current source that substantially maintains current values between times for calibration. Both low precision DAC 20 and current source 16 are calibrated while off-line. Following calibration, the recently calibrated auxiliary low precision DAC 20 and spare current source 16 are selected to generate current for composite high precision DAC 10. By auxiliary low precision DAC 20 and spare current source 16 contributing a portion of the total current generated by DAC 10, the accuracy of composite high precision DAC 10 is improved.

Figure 1:
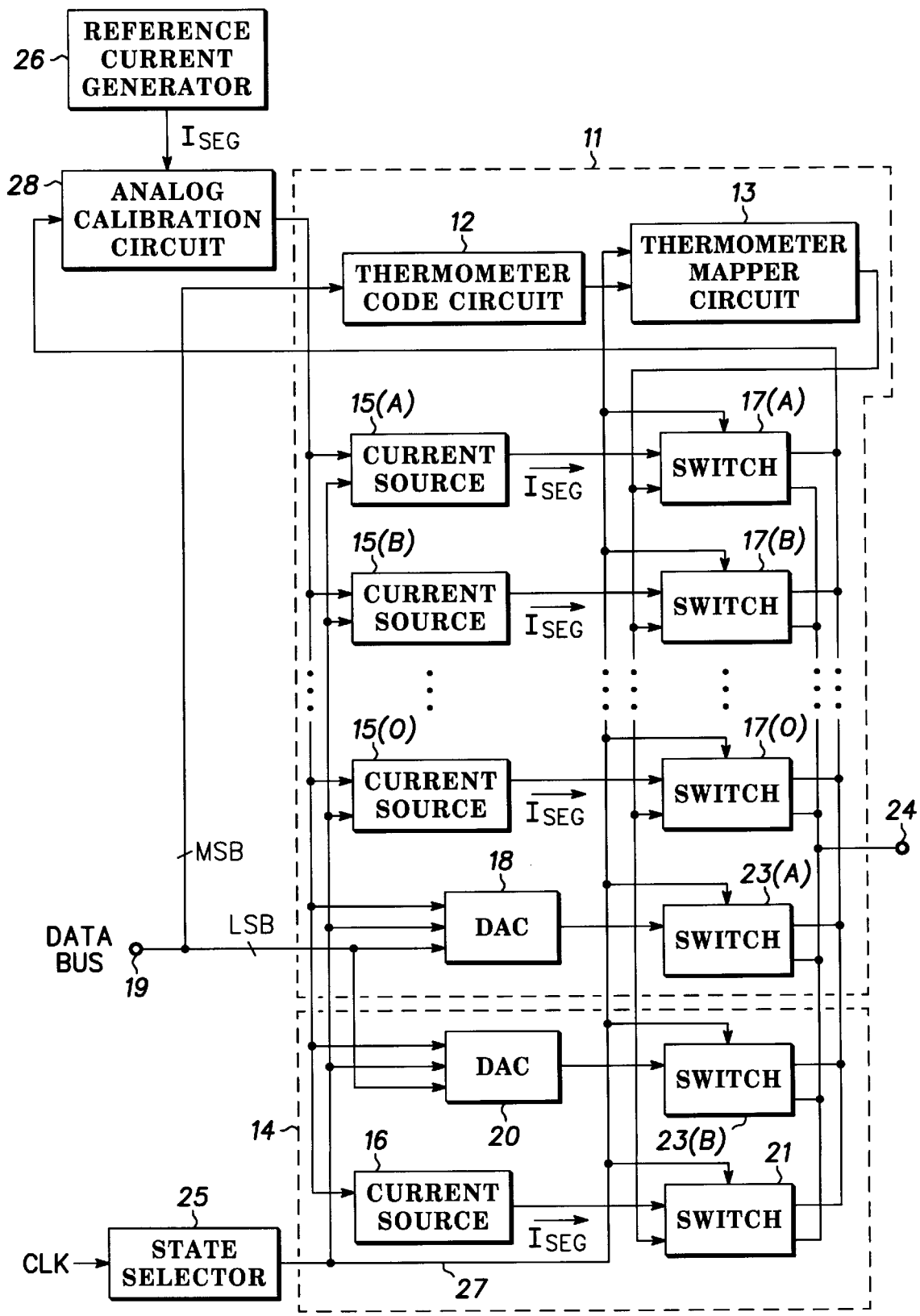
FIG. 1 is a block diagram of a composite high precision DAC in accordance with the present invention.

FIG. 1 is a block diagram of a composite high precision DAC 10 having an input port 19 and an output terminal 24 in accordance with the present invention. Input port 19 is connected to a data bus that transmits a digital data stream of binary data having most significant bits and least significant bits. Composite high precision DAC 10 includes a reference current generator 26 having an output for supplying a reference current $I_{SEG}$. The output of reference current generator 26 is connected to a first input of an analog calibration circuit 28.

Composite high precision DAC 10 further includes a primary DAC conversion circuit 11 having a plurality of inputs and a plurality of outputs. A first input of primary DAC conversion circuit 11 is connected to input port 19. A second input of primary DAC conversion circuit 11 is connected to an output of a state selector 25, which in turn is coupled for receiving a clock signal, CLK. A third input of primary DAC conversion circuit 11 is connected to an output of analog calibration circuit 28. A first output of primary DAC conversion circuit 11 is connected to output terminal 24. A second output of primary DAC conversion circuit 11 is connected to a second input of analog calibration circuit 28. Although not shown in FIG. 1, it should be understood that switches 17(A), ..., 17(O) could be configured to transfer current to a supply rail rather than output terminal 24 or to the input of analog calibration circuit 28.

Composite high precision DAC 10 further includes spare DAC circuit 14 having a plurality of inputs and a plurality of outputs. A first input of spare DAC circuit 14 is connected to input port 19, a second input is connected to the output of state selector 25, a third input is connected to the output of analog calibration circuit 28, and a fourth input is connected to an output of a thermometer mapper circuit 13. A first output of spare DAC circuit 14 is connected to output terminal 24. A second output of spare DAC circuit 14 is connected to the second input of analog calibration circuit 28. Although not shown in FIG. 1, it should be understood that switches 23(A) and 23(B) could be configured to transfer current to a supply rail rather than output terminal 24 or to the input of analog calibration circuit 28.

Spare DAC circuit 14 includes a current source 16 and a switch 21, as well as a DAC 20 and a switch 23(B). Primary DAC conversion circuit 11 includes a plurality of current sources 15(A), 15(B), . . . , 15(O) and a plurality of switches 17(A), 17(B), . . . , 17(O). The reference letters A, B, . . . , O are appended to the reference numbers of the current sources and the switches to denote current source/switch pairs. In particular, current sources 15(A), 15(B), . . . , 15(O), and 16 each have a current control input, a digital input, and a current output. Switches 17(A), 17(B), . . . , 17(O), and 21 each have a current input, a data input, a selector input, a calibration output, and a current output. The current output of current source 16 is coupled to the current input of switch 21 such that current source 16 and switch 21 cooperate to form a current source/switch pair. Other current source/switch pairs are formed by current source 15(A) and switch 17(A), current source 15(B) and switch 17(B), and current source 15(O) and switch 17(O). Current sources 15(A), 15(B), . . . , 15(O), and 16 each generate a current $I_{SEG}$ when calibrated. The commonly connected current control inputs of current sources 15(A), 15(B), . . . , 15(O), and 16 are connected to the output of analog calibration circuit 28. The digital inputs of current sources 15(A), 15(B), . . . , 15(O), and 16 are connected to the output of state selector 25 via an eighteen-bit bus. The selector inputs of switches 17(A), 17(B), . . . , 17(O), 21, and a first input of a thermometer mapper circuit 13 are connected to the output of state selector 25 via an eighteen-bit bus. Data inputs of switches 17(A), 17(B), . . . , 17(O), and 21 are connected to an output of thermometer mapper circuit 13 via a sixteen-bit bus. The calibration outputs of switches 17(A), 17(B), . . . , 17(O), and 21 are commonly connected to the second input of analog calibration circuit 28. The commonly connected current outputs of switches 17(A), 17(B), . . . , 17(O), and 21 are connected to output terminal 24.

Primary DAC conversion circuit 11 further includes a primary low precision DAC 18 having a first input connected to the portion of the data bus, DATA BUS, conducting the Least Significant Bits (LSBS) of the data bus. It should be noted that data bus, DATA BUS, is connected to input port 19 and is split into two bus portions, i.e., the portion transmitting the LSBs and the portion transmitting the Most Significant Bits (MSBs). The first input of primary low precision DAC 18 is connected to the portion of the data bus conducting the LSBs. Thermometer code circuit 12 has an input connected to input port 19 via the portion of the data bus transmitting the MSBs. In other words, signals transmitted on the MSB portion of the data bus correspond to the higher ordered bits and are the MSB signals, while signals transmitted on the LSB portion of the data bus correspond to the lower ordered bits and are the LSB signals. A second input of primary low precision DAC 18 is connected to the output of analog calibration circuit 28. A third input of primary low precision DAC 18 is connected to the output of state selector 25. An output of primary low precision DAC 18 is connected to a current input of a switch 23(A). A selector input of switch 23(A) is connected to the output of state selector 25. A calibration output of switch 23(A) is connected to the second input of analog calibration circuit 28 and a current output of switch 23(A) is connected to output terminal 24. In addition, a second input of thermometer mapper circuit 13 is connected to an output of thermometer code circuit 12.

Spare DAC circuit 14 includes auxiliary low precision DAC 20 having a first input connected to input port 19 via the LSB portion of the data bus. A second input of auxiliary low precision DAC 20 is connected to the output of analog calibration circuit 28. A third input of auxiliary low precision DAC 20 is connected to the output of state selector 25. An output of auxiliary low precision DAC 20 is connected to a current input of a switch 23(B). The selector input of switch 23(B) is connected to the output of state selector 25. A calibration output of switch 23(B) is connected to the second input of analog calibration circuit 28 and a current output of switch 23(B) is connected to output terminal 24.

Although a primary DAC conversion circuit 11 is shown as a combination of a single low precision DAC 18 in combination with fifteen current sources, i.e., current sources 15(A), 15(B), . . . , 15(O), this is not a limitation of the present invention. In other words, primary DAC conversion circuit 11 could have any number of low precision DACs and current sources. The currents provided by DACs 18 and 20 range from zero to a full-scale current $I_{SEG}$. In addition, current sources 15(A), 15(B), . . . , 15(O), and 16 are each calibrated to provide a current of $I_{SEG}$. It should be noted that composite high precision DAC 10 generates a current at output terminal 24 that is the sum of the currents generated by DAC 18 and current sources 15(A), 15(B), . . . , 15(O). Spare DAC 20 and spare current source 16 are off-line for calibration and do not contribute current to output terminal 24. Instead, the current generated by spare DAC 20 or spare current source 16 is transmitted to analog calibration circuit 28 for comparison against a current $I_{SEG}$ that is generated by reference current generator 26. The calibration of DAC 10 is accomplished by the calibration of individual current sources 15(A), 15(B), . . . , 15(O), and 16, and DACs 18 and DAC 20. Accordingly, the full-scale current of composite high precision DAC 10 is the sum of the current $I_{SEG}$ from DAC 18 or DAC 20, and the currents $I_{SEG}$ from fifteen current sources in the group of current sources 15(A), 15(B), . . . , 15(O), and 16. It should be further noted that the current provided by composite high precision DAC 10 is the sum of the currents from the selected current sources 15(A)–15(O) and 16 along with a portion or all of the full-scale current provided by DAC 18 or DAC 20. Thus, in the embodiment of FIG. 1, composite high precision DAC 10 provides a current ranging from zero to a full-scale current substantially equal to sixteen times the current $I_{SEG}$.

TABLE 1 illustrates the relationship between the four MSB signals on the data bus and the signals appearing at the ouputs of thermometer code circuit 12. The top row of TABLE 1 is referred to as the MSByte code. MSByte code values range from 0 to 15, with MSByte code 0 corresponding to MSB signals on the data bus having values of 0000 and MSByte code 15 corresponding to MSB signals having values of 1111.

TABLE 1

| MSByte Code TCLN | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| 14 | 0 | 0 | 0 | 0 | 0 | 0 | 0 | 0 | 0 | 0 | 0 | 0 | 0 | 0 | 0 | 1 |
| 13 | 0 | 0 | 0 | 0 | 0 | 0 | 0 | 0 | 0 | 0 | 0 | 0 | 0 | 0 | 1 | 1 |
| 12 | 0 | 0 | 0 | 0 | 0 | 0 | 0 | 0 | 0 | 0 | 0 | 0 | 0 | 1 | 1 | 1 |
| 11 | 0 | 0 | 0 | 0 | 0 | 0 | 0 | 0 | 0 | 0 | 0 | 0 | 1 | 1 | 1 | 1 |
| 10 | 0 | 0 | 0 | 0 | 0 | 0 | 0 | 0 | 0 | 0 | 0 | 1 | 1 | 1 | 1 | 1 |
| 9 | 0 | 0 | 0 | 0 | 0 | 0 | 0 | 0 | 0 | 0 | 1 | 1 | 1 | 1 | 1 | 1 |
| 8 | 0 | 0 | 0 | 0 | 0 | 0 | 0 | 0 | 0 | 1 | 1 | 1 | 1 | 1 | 1 | 1 |
| 7 | 0 | 0 | 0 | 0 | 0 | 0 | 0 | 0 | 1 | 1 | 1 | 1 | 1 | 1 | 1 | 1 |
| 6 | 0 | 0 | 0 | 0 | 0 | 0 | 0 | 1 | 1 | 1 | 1 | 1 | 1 | 1 | 1 | 1 |
| 5 | 0 | 0 | 0 | 0 | 0 | 0 | 1 | 1 | 1 | 1 | 1 | 1 | 1 | 1 | 1 | 1 |
| 4 | 0 | 0 | 0 | 0 | 0 | 1 | 1 | 1 | 1 | 1 | 1 | 1 | 1 | 1 | 1 | 1 |
| 3 | 0 | 0 | 0 | 0 | 1 | 1 | 1 | 1 | 1 | 1 | 1 | 1 | 1 | 1 | 1 | 1 |
| 2 | 0 | 0 | 0 | 1 | 1 | 1 | 1 | 1 | 1 | 1 | 1 | 1 | 1 | 1 | 1 | 1 |
| 1 | 0 | 0 | 1 | 1 | 1 | 1 | 1 | 1 | 1 | 1 | 1 | 1 | 1 | 1 | 1 | 1 |
| 0 | 0 | 1 | 1 | 1 | 1 | 1 | 1 | 1 | 1 | 1 | 1 | 1 | 1 | 1 | 1 | 1 |

Thermometer code circuit 12 provides fifteen output signals to thermometer mapper circuit 13 in accordance with an MSByte code value. The left column of TABLE 1 is a listing of Thermometer Code Level Numbers (TCLNs), with values ranging from 14 at the top of the table to 0 at the bottom of the table. The number of Thermometer Code (Tcode) bits that have a logic one value increases linearly with an increasing binary value of the MSB signals on the data bus. This linear relationship is illustrated in TABLE 1 and ranges from zero bits having a one value for an MSByte code value of 0 to fifteen bits having a one value for an MSByte code value of 15. It should be noted that for common distributions of data codes, a TCLN of 0 typically has the highest probability of having an asserted state, i.e., a logic one value, while a TCLN of 14 typically has the lowest probability of having logic one values.

The MSB signals are encoded in thermometer code circuit 12 using a Tcode to determine the logic values of the signals at the output of thermometer code circuit 12. For example, when the MSB signals have values of 0000, corresponding to an MSByte code of 0, the fifteen bits of data generated at the output of thermometer code circuit 12 are the values listed in the column under MSByte code 0. The entry for MSByte code 0 is all zeroes. In a second example, when the MSB signals have values of 1111, corresponding to an MSByte code of 15, the fifteen bits of data generated at the output of thermometer code circuit 12 are the values listed in the column under MSByte code 15. The entry for MSByte code 15 is all ones.

Figures 4, 5:
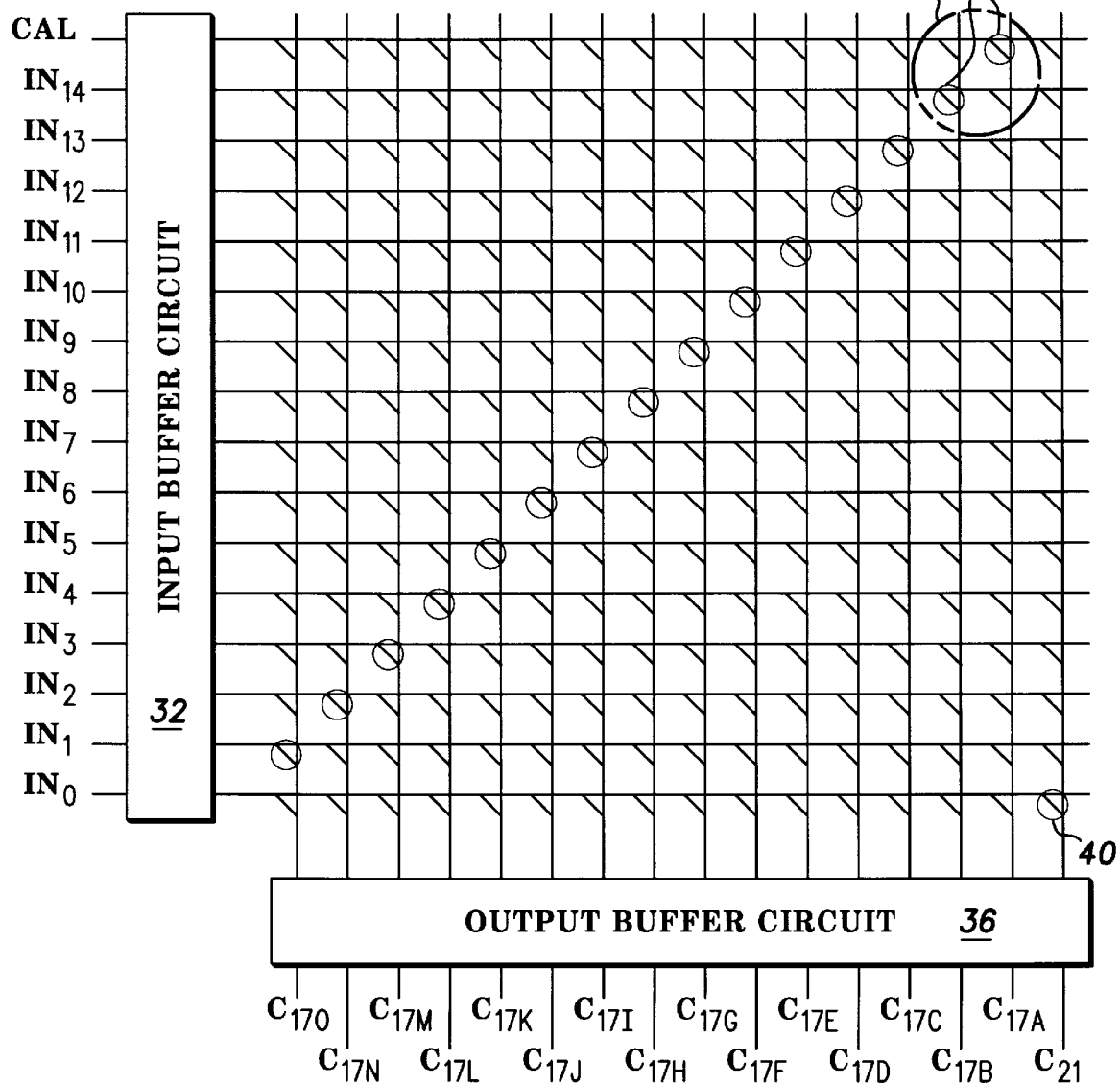
FIG. 4 is a block diagram of a thermometer mapper circuit that has a particular state value in accordance with the present invention.
FIG. 5 is an exploded view of a portion of an array shown in FIG. 4.
Figures 6, 7:
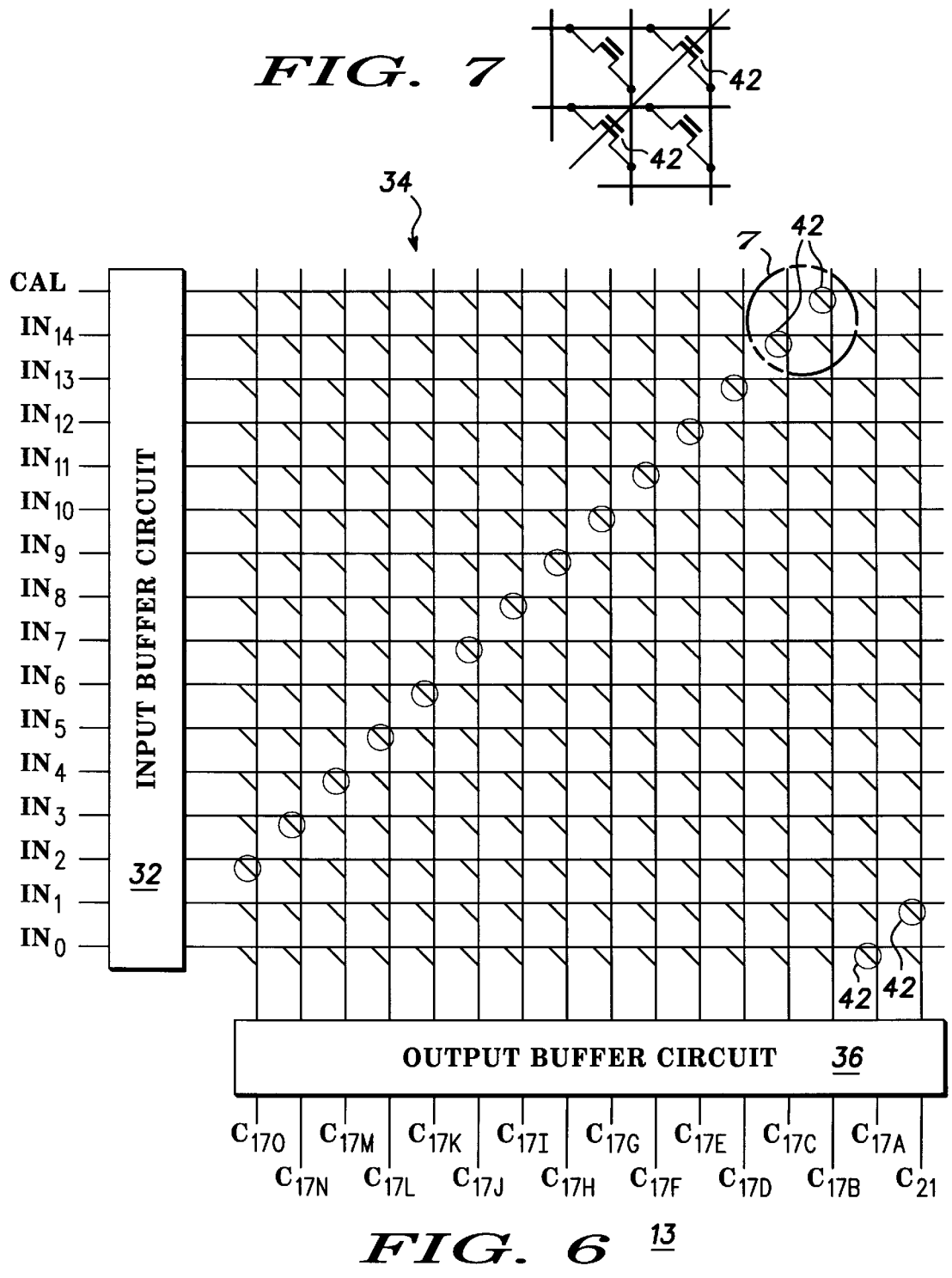
FIG. 6 is a block diagram of a thermometer mapper circuit that has a particular state value in accordance with the present invention.
FIG. 7 is an exploded view of a portion of an array shown in FIG. 6.

FIGS. 2, 4, and 6 are block diagrams of thermometer mapper circuit 13 that have a particular state value in accordance with the present invention. FIGS. 3, 5, and 7 are exploded views of a portion of array 34 as shown in FIGS. 2, 4, and 6, respectively. It should be noted that the same reference numbers are used in the figures to denote the same elements. Thermometer mapper circuit 13 is referred to as a cross-point switch array and provides electrical conduction paths that are enabled in accordance with a state value. Thus, the diagonal lines connecting rows with columns shown in FIGS. 2, 4, and 6 are "possible" connections that are controlled by the state value. The input signals received from thermometer code circuit 12 are transferred to selected outputs of thermometer mapper circuit 13 in accordance with the state value. By changing the state value, the input signals are transferred or mapped to different outputs of thermometer mapper circuit 13.

Thermometer mapper circuit 13 includes an input buffer circuit 32 coupled for receiving input signals CAL and $IN_{14}$–$IN_0$ from thermometer code circuit 12. The input signals CAL and $IN_{14}$–$IN_0$ are mapped to appear at the outputs of output buffer circuit 36 and provide output signals $C_{17A}$–$C_{17P}$. In particular, the signals received by input buffer circuit 32 are transferred to the rows of an M by N array 34, where M and N are the respective numbers of rows and columns in array 34. Array 34 is configured with electrical conduction paths that are enabled when selected by a particular state value. In other words, a digital switch having a control terminal, and first and second current carrying terminals is located at each row-column intersection in array 34. The digital switch has a first current carrying terminal connected to the row of array 34 and a second current carrying terminal connected to the column of array 34 for transferring a signal from the row to the column. The diagonal lines connecting a row to a column in FIGS. 2, 4, and 6 do not imply an electrical short but rather the location of the digital switch that in the conduction mode provides a signal path from the row to the column.

In accordance with the state value, the digital switch is either in the conduction mode or the non-conduction mode. Switches 38 in FIGS. 2 and 3 are configured to have commonly connected control terminals that receive a state signal. It should be noted that the control terminals of switches 38 and the connecting line are not shown. Likewise, switches 40 in FIGS. 4 and 5 are configured to have commonly connected control terminals, and switches 42 in FIGS. 6 and 7 are configured to have commonly connected control terminals. For simplicity of explanation, a circle at the row-column intersection of array 34 indicates the commonly connected control terminals of digital switches 38 in FIG. 2, the commonly connected control terminals of digital switches 40 in FIG. 4, and the commonly connected control terminals of digital switches 42 in FIG. 6. Again, the control terminals of switches 40 and 42 of FIGS. 4 and 6, respectively, and the connecting lines are not shown. By way or example, the digital switches in array 34 are transistors that can be Field Effect Transistors (FETs), ferroelectric Metal Oxide Semiconductor Field Effect Transistors (MOSFETs), or the like.

In operation, current source 16 and DAC 20 (FIG. 1) are selected by state selector 25 and thermometer mapper circuit 13 for calibration. The output currents of current source 16 and DAC 20 do not contribute current to the total current at output terminal 24. Instead, the currents from current sources 15(A)–15(O) and DAC 18 are selected to contribute to the total current at output terminal 24. A signal generated by state selector 25 at the selector input of switch 21 transfers the current $I_{SEG}$ that is generated by current source 16 to the input of analog calibration circuit 28. The current from current source 16 is compared with the reference current $I_{SEG}$ from reference current generator 26, and a correction signal is sent to current source 16. State selector 25 selects current source 16 for receiving the correction signal from the output of analog calibration circuit 28. Thus, current source 16 is calibrated. A signal generated by state selector 25 at the selector input of switch 23(B) transfers the current $I_{SEG}$ that is generated by DAC 20 to the input of analog calibration circuit 28. The current from DAC 20 is compared with the reference current $I_{SEG}$ from reference current generator 26, and a correction signal is sent to DAC 20. State selector 25 sends a signal to the third input of DAC 20 that causes DAC 20 to receive the correction signal from the output of analog calibration circuit 28. Thus, DAC 20 is calibrated.

State selector 25 generates states such as, for example, state 0, state 1, state 2, etc. State selector 25 provides signals that are routed as part of calibration bus 27 to the digital inputs of current sources 15(A), 15(B), . . . 15(O), and 16, to the third inputs of DACs 18 and 20, and to the selector inputs of switches 17(A)–17(O), 21, 23(A) and 23(B), and the first input of thermometer mapper circuit 13. By way of example, state selector 25 is a counter/decoder circuit. The counter switches to a new state when clock signal CLK transitions from one level to another level. Alternatively, state selector 25 could be a shift register that shifts a single one into a field of zeroes. Only one output of the shift register would have a logic one level and the position of that logic one value in the shift register indicates the state value at the output of state selector 25. For the embodiment illustrated in FIG. 1, the shift register is an eighteen bit shift register. Each bit location of the shift register provides an output signal that represents the state value of state selector 25. The eighteen states allow selection of the sixteen current sources and two DACs for calibration, i.e., current sources 15(A), 15(B), . . . , 15(O), 16, and DACs 18 and 20. A periodic clock signal CLK provides a time that is sufficient for calibration of each current source. For example, a clock period of about 20 milliseconds (ms) is adequate for calibrating each of the current sources 15(A), 15(B), . . . , 15(O), and 16. Alternatively, the clock signal CLK could be generated by analog calibration circuit 28 when the current from switches 17(A), 17(B), . . . , 17(O), 23(A), 23(B), or 21 is substantially matched to the current $I_{SEG}$ from reference current generator 26.

FIG. 2 is a block diagram of thermometer mapper circuit 13 that illustrates a state value of 0. Thermometer mapper circuit 13 transfers the input signals CAL and $IN_{14}$–$IN_0$ to output signals $C_{21}$, $C_{17A}$, . . . , $C_{17O}$, respectively. The signals $C_{21}$, $C_{17A}$, . . . , $C_{17O}$ are transmitted to the data inputs of switches 21, 17(A), 17(B), . . . , 17(O), respectively. A logic one signal at the data input of switches 17(A), 17(B), . . . , 17(O) transfers the current from respective current sources 15(A), 15(B), . . . , 15(O) to output terminal 24. It should be noted that the signal CAL at the input of thermometer mapper circuit 13 is transferred to output port $C_{21}$ and a signal at output port $C_{21}$ selects switch 21 for calibration. The signal CAL causes the current from switch 21 to be transferred to the input of analog control signal 28. State selector 25 selects current source 16 to receive the correction current value from analog calibration circuit 28.

The current generated by current source 16 is transmitted to analog calibration circuit 28 and compared with a current generated by reference current generator 26. The current generated by current source 16 is decreased when its value is greater than the value of the current from reference current generator 26. The current generated by current source 16 is increased when its value is less than the value of the current from reference current generator 26. Current source 16 is calibrated when its adjusted current $I_{SEG}$ substantially matches the current $I_{SEG}$ generated by reference current generator 26.

With current source 16 calibrated, the next current source to be calibrated is selected by state selector 25 and thermometer mapper circuit 13. As shown in FIG. 2, the input signal $IN_{14}$ is transferred to port $C_{17A}$ in anticipation that current source 15(A) is the next current source selected for calibration. It should be noted that current source 15(A) has not been calibrated for a time that is longer than any other current source, i.e., of all the current sources, it has been the longest time since current source 15(A) has been calibrated. Signal $IN_{14}$ is assigned a TCLN level 14 (see TABLE 1) and has the least likely probability of an occurrence of a logic one level. The mapping of $IN_{14}$ to port $C_{17A}$ ensures that current source 15(A) is the least likely current source for contributing current to output terminal 24. In other words, current source 15(A) only contributes current when composite high precision DAC 10 requires a near full-scale output current. It should be noted that current source 16 is the most recently calibrated current source.

FIG. 4 is a block diagram of thermometer mapper circuit 13 that illustrates a state value of 1. Thermometer mapper circuit 13 transfers the input signals $IN_{14}$–$IN_1$ to output ports $C_{17B}$–$C_{17O}$, respectively. In addition, the input signal $IN_0$ is transferred to the output port $C_{21}$ and the input signal CAL is transferred to the output port $C_{17A}$. Thus, state selector 25 and thermometer mapper circuit 13 select current source 15(A) for calibration. On the other hand, the signal $IN_0$ which has the highest probability of an occurrence of a logic one level is transferred to the output port $C_{21}$. An output signal at port $C_{21}$ selects switch 21 for transferring an accurate current $I_{SEG}$ from the most recently calibrated current source, i.e., current source 16, to output terminal 24.

It should be noted that from TABLE 1, TCLN 0 has the highest probability for use, i.e., the most logic one values occur at that level. Thus, signal $IN_0$ is transferred to the data input of the most recently calibrated current source, current source 16. It should be further noted that input signal CAL is transferred to the output port $C_{17A}$ and current source 15(A) is selected for calibration. The current generated by current source 15(A) is transmitted to analog calibration circuit 28 for comparison with the current $I_{SEG}$ generated by reference current generator 26. The current generated by current source 15(A) is decreased when its current is greater than the current from reference current generator 26. The current generated by current source 15(A) is increased when its current is less than the current from reference current generator 26. Current source 15(A) is calibrated when its adjusted current $I_{SEG}$ substantially matches the current $I_{SEG}$ generated by reference current generator 26.

FIG. 6 is a block diagram of thermometer mapper circuit 13 that illustrates a state value of 2. Thermometer mapper circuit 13 transfers the input signals $IN_{14}$–$IN_2$ to output signals $C_{17C}$–$C_{17O}$, respectively. In addition, the input signal $IN_1$ is transferred to the output port $C_{21}$, the input signal $IN_0$ is transferred to the output port $C_{17A}$, and the input signal CAL is transferred to the output port $C_{17B}$.

should be noted that signal $IN_0$ is transferred to the output port $C_{17A}$ so that the most recently calibrated current source 15(A) has the highest probability of contributing current to output terminal 24 of composite high precision DAC 10 (FIG. 1). It should be further noted that input signal CAL is transferred to the output port $C_{17B}$ and cuvrrent source 15(B) is selected for calibration. The current from current source 15(B) is transferred through switch 17(B) to analog calibration circuit 28 for calibration. The current generated by current source 15(B) is decreased when its current is greater than the current from reference current generator 26. The current generated by current source 15(B) is increased when its current is less than the current from reference current generator 26. Current source 15(B) is calibrated when its adjusted current $I_{SEG}$ substantially matches the current generated by reference current generator 26.

Preferably, after several current sources are calibrated, DACs 18 and 20 can also be calibrated. For example, state selector 25 may select either switch 23A or 23(B) and the full-scale current of either DAC 18 or DAC 20 is transferred to analog calibration circuit 28 for calibration. During calibration, the full-scale current generated by either DAC 18 or DAC 20 is decreased when its full-scale current is greater than the current from reference current generator 26. The full-scale current generated by DAC 18 or DAC 20 is increased when its full-scale current is less than the current from reference current generator 26. DACs 18 and 20 are calibrated when the generated full-scale current substantially matches the current $I_{SEG}$ generated by reference current generator 26.

Thermometer code circuit 12, thermometer mapper circui 13, and state selector 25 have been described as separate circuit blocks. It should be noted that a Programmable Logic Array (PLA) used as a decoder and state machine can also provide the desired mapping of the signals to the inputs of switches 17(A)–17(O), 21, 23(A) and 23(B), and the control signals to the inputs of current sources 15(A), 15(B), . . . 15(O), and to DACs 18 and 20. The type of circuitry used for a decoder and state machine is not intended as a limitation of the present invention.

By now it should be appreciated that a structure and method have been provided for calibrating a segmented high precision DAC in the background without taking the high precision DAC off-line or out of service. The structure and method allow the most recently calibrated current source to contribute current having the highest probability of uspe, thus, maximizing the linearity of the high precision DAC. The current source having the lowest probability for supplying current to output terminal 24 is selected for calibration.

I claim:

1. A method of operating a segmented digital-to-analog converter (DAC) having a plurality of segments, comprising the steps of:
   receiving a data signal at an input of the segmented DAC that is encoded for providing a plurality of encoded signals; and
   mapping the plurality of encoded signals in response to a first state of a state signal to a plurality of select signals that select a first segment for calibration and a second segment for providing a current to a summing node.

2. The method of claim 1, further including the step of remapping the plurality of encoded signals in response to a second state of the state signal to the plurality of control signals that select the first segment for supplying the current to the summing node.

3. The method of claim 1, wherein selecting the first segment for supplying the current further includes the step of selecting a most recently calibrated segment for supplying the current to the summing node.

4. The method of claim 1, wherein selecting the first segment for calibration further includes the steps of:
   transferring the current from the first segment to a calibration circuit; and
   receiving a reference current at the calibration circuit for comparing with the current from the first segment and providing a correction signal that adjusts the first segment for providing a calibrated current.

5. The method of claim 1, wherein encoding a data signal further includes the step of using a thermometer code.

6. The method of claim 1, wherein the steps of mapping and remapping further include the step of using a cross-point switch array for selectively transferring the plurality of encoded signals to the plurality of select signals.

7. The method of claim 1, further including the step of clocking a state selector for changing the state signal.

8. A method of calibrating a segmented digital-to-analog converter (DAC) having a plurality of segments, comprising the steps of:

calibrating a first segment of the plurality of segments for providing a first calibrated current;
   mapping a plurality of encoded signals to a plurality of select signals that transfer the first calibrated current to a summing node and select a second segment for calibration;
   calibrating the second segment to provide a second calibrated current; and
   changing a state signal after calibrating the second segment that remaps the plurality of encoded signals to the plurality of select signals and transfers the second calibrated current to the summing node.

9. The method of claim 8, wherein changing the state signal further includes the step of reconfiguring a mapper circuit to provide a full-scale current from a most recently calibrated segment for transfer to the summing node.

10. The method of claim 9, wherein changing the state signal further includes the step of assigning a highest probability of generating a current for the segmented DAC to the most recently calibrated segment.

11. The method of claim 8, wherein changing the state signal further includes the step of selecting a third segment for calibration.

12. The method of claim 8, wherein calibrating the first segment further includes the steps of:
   transferring a first current from the first segment to a calibration circuit;
   receiving a reference current by the calibration circuit for comparing with the first current from the first segment; and
   providing a correction signal to the first segment that adjusts the first current to provide the first calibrated current.

13. The method of claim 8, wherein mapping a plurality of encoded signals includes the steps of;
   receiving encoded signals from a thermometer code circuit; and
   using a cross-point switch for transferring the plurality of encoded signals to the plurality of select signals.

14. A segmented digital-to-analog converter (DAC), comprising:
   a mapper circuit having a first input coupled for receiving encoded signals, a second input coupled for receiving state selector signals that transfer one of the encoded signals to an output signal of the mapper circuit;
   a current source having an input coupled for receiving the state selector signals and an output for providing a current; and
   a switch having a first input coupled for receiving the output signal from the mapper circuit, a second input coupled to the output of the current source, and a first output for providing a current to an output of the segmented DAC.

15. The segmented DAC of claim 14, further comprising an encoder circuit having an input coupled for receiving a data signal and an output for providing the encoded signals.

16. The segmented DAC of claim 15, wherein the encoded signals are thermometer code signals.

17. The segmented DAC of claim 15, wherein the switch further includes a second output for providing the current from the current source for calibrating with a reference current.

* * * * *